United States Patent [19]
Gielis et al.

[11] Patent Number: 5,230,011
[45] Date of Patent: Jul. 20, 1993

[54] RECEIVER

[75] Inventors: Gerardus C. M. Gielis; Rudy J. van der Plassche, both of Eindhoven, Netherlands

[73] Assignee: U.S. Philips Corporation, New York, N.Y.

[21] Appl. No.: 782,048

[22] Filed: Oct. 24, 1991

[30] Foreign Application Priority Data

Nov. 15, 1990 [NL] Netherlands ............... 9002489

[51] Int. Cl.$^5$ .................................... H04L 27/06
[52] U.S. Cl. ...................... 375/97; 375/103; 455/324
[58] Field of Search ............ 329/315, 347, 350; 375/23, 46, 76, 77, 78, 79, 97; 455/131, 324

[56] References Cited

U.S. PATENT DOCUMENTS

| | | | |
|---|---|---|---|
| 3,924,195 | 12/1975 | Matouka | 328/181 |
| 3,976,869 | 8/1976 | Stella et al. | 341/110 X |
| 4,628,286 | 12/1986 | Nossen | 455/110 X |
| 4,803,700 | 2/1989 | Dewey et al. | 375/77 |
| 4,896,336 | 1/1990 | Henely et al. | 375/97 |
| 4,901,151 | 2/1990 | Mehrgardt et al. | 358/188 |
| 5,134,578 | 7/1992 | Garverick et al. | 364/752 |

Primary Examiner—Curtis Kuntz
Assistant Examiner—Bryan E. Webster

[57] ABSTRACT

Receiver having an A/D converter for digitally sampling an analog signal modulated on a carrier frequency at a first sampling frequency, consecutively coupled to a digital quadrature mixer stage for a carrier frequency shift of the digitized modulated signal from the A/D converter, a digital filter device for selecting the phase quadrature signals of the quadrature mixer stage and for decimating the sampling frequency from the first sampling frequency to a second sampling frequency, and a digital demodulation device. To obtain a receiver which can be easily realized in an integrated form and for which less crystal surface is required than for the digital integrable receivers hitherto known, and which is particularly suitable for receiving RF radio or TV broadcast signals, the digital quadrature mixer stage includes comprises a first coordinate rotation digital computer (Cordic) in the rotation mode, having at least a first signal input which is coupled to an output of the A/D converter and a phase signal input to which a periodical digital sawtooth-shaped phase signal is applied from a digital sawtooth generator for a periodical $2\pi$ phase rotation of at least the signal applied to the computer via the first signal input at a repetition frequency which is equal to the magnitude of the carrier frequency shift.

17 Claims, 4 Drawing Sheets

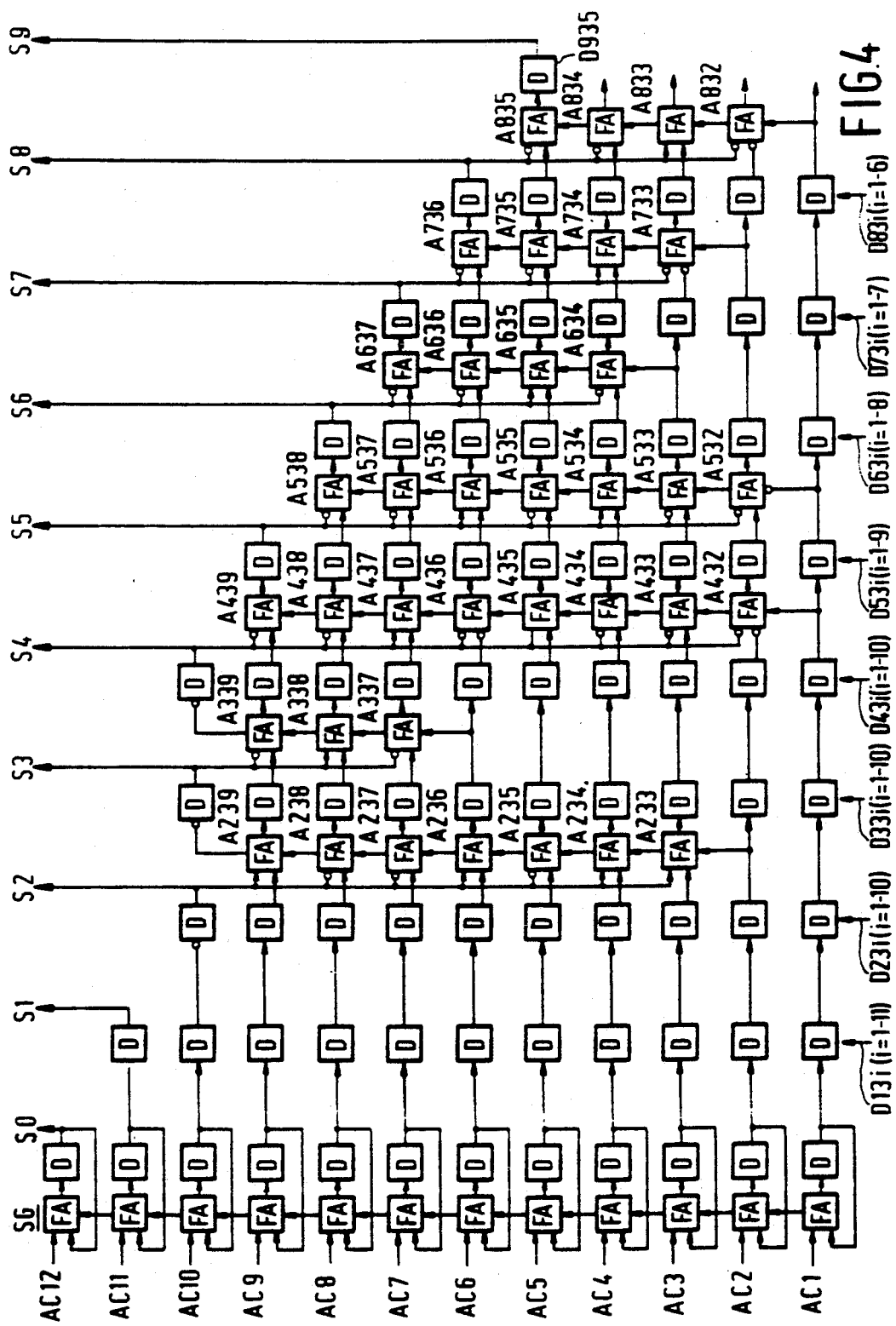

RECEIVER

BACKGROUND OF THE INVENTION

1. Field of the Invention

The invention relates to a receiver comprising an A/D converter for digitally sampling an analog signal modulated on a carrier frequency at a first sampling frequency, consecutively coupled to a digital quadrature mixer stage for a carrier frequency shift of the digitized modulated signal from the A/D converter, provided with first and second signal outputs via which the digital quadrature mixer stage supplies a pair of carrier converted phase quadrature signals, a digital filter device for selecting the phase quadrature signals of the quadrature mixer stage and for decimating the sampling frequency from said first sampling frequency to a second sampling frequency, and a digital demodulation device.

2. Description of the Related Art

A receiver of this type is known from European Patent Application no. 35166.

The known receiver is of the direct conversion type in which the analog RF reception signals are first digitized at the first sampling frequency and subsequently multiplied in a pair of multiplier circuits of the digital quadrature mixer stage by a pair of tunable digital phase quadrature oscillator signals which are supplied from a digital quadrature tuning oscillator. The digitized RF reception signals are thereby split in phase into I (in-phase) and Q (quadrature) signals which differ mutually 90° in phase, and the digitized RF reception signal whose RF carrier frequency corresponds to the tuning frequency of the digital phase quadrature oscillator signals is also shifted in frequency towards the baseband. The desired digital I and Q baseband phase quadrature signals are selected in the digital filter device in which simultaneously the sampling frequency is reduced (decimated) from the first sampling frequency to the second sampling frequency. The digital I and Q baseband signals thus selected are subsequently demodulated in the digital demodulation device to a single digital baseband signal which is applied to a reproducing device via a D/A converter.

For an effective realization of the known receiver, the use of complex digital multipliers in the oscillator circuit as well as in the mixer stage is inevitable. An integrated embodiment therefore requires a comparatively large crystal surface. Moreover, the quadrature tuning oscillator should generate tunable digital sine and cosine oscillator signals having a comparatively low distortion. Particularly in the frequency range of normal radio and television broadcast transmitters, it is difficult to comply with this distortion requirement, which makes the known receiver less suitable for use as a receiver of broadcast signals.

SUMMARY OF THE INVENTION

The invention has for its object to provide a receiver which is easier to realize as compared with said known digital receiver and which in an integrated form requires less crystal surface, while a correctly chosen dimensioning renders it suitable, inter alia, for receiving RF radio or TV broadcast signals.

A receiver comprising an A/D converter for digitally sampling an analog signal modulated on a carrier frequency at a first sampling frequency, consecutively coupled to a digital quadrature mixer stage for a carrier dash frequency shift of the digitized modulated signal from the A/D converter, provided with first and second signal outputs via which the digital quadrature mixer stage supplies a pair of carrier frequency converted phase quadrature signals, a digital filter device for selecting the phase quadrature signals of the quadrature mixer stage and for decimating the sampling frequency from said first sampling frequency to a second sampling frequency, and a digital demodulation device, is therefore characterized in that the digital quadrature mixer stage comprises a first coordinate rotation digital computer (Cordic) in the rotation mode, having at least a first signal input which is coupled to an output of the A/D converter and a phase signal input which is coupled to an output of a digital sawtooth generator, said digital sawtooth generator supplying a periodical digital sawtooth-shaped phase signal to the phase signal input of said computer for a periodical $2\pi$ phase rotation of at least the signal applied to the computer via the first signal input at a repetition frequency which is equal to the magnitude of said carrier frequency shift, said computer supplying at the first and second signal outputs said pair of carrier frequency converted phase quadrature signals to the digital filter device.

The use of a coordinate rotation digital computer, hereinafter referred to as Cordic for short, for fast digital trigonometric computations is known from the article "The Cordic Trigonometric Computing Technique", published in "IRE Transactions on Electronic Computers", September 1959 by J. E. Volder. The computations are effected via simple signal processing operations such as binary shifts, additions, subtractions and calling prestored constants. The Cordic thus has a very simple and compact integrable circuit structure which in an integrated form requires a comparatively small crystal surface.

The invention is based on the recognition that a Cordic, which operates in the so-called rotation mode, in which mode a polar signal representation is converted into a cartesian representation, can function as a mixer oscillator circuit in combination with a sawtooth generator at the phase signal input in the case of a correctly chosen dimensioning. The carrier frequency of the input signal of the Cordic is converted or shifted over a frequency which is equal to the repetition frequency of the signal supplied by the sawtooth generator to the first Cordic, which signal will hereinafter be referred to as phase signal for short.

When using the measure according to the invention, the digital mixer oscillator circuit constituted by the combination of the first Cordic in the rotation mode and the sawtooth generator effects a conversion of the digitized signals modulated on said carrier frequency, dependent on the repetition frequency of the phase signal to the baseband or to a fixed intermediate frequency without the formation of digital sine and/or cosine oscillator signals and/or accurate signal multiplications being required.

This provides a simple integrable realization of a digital receiver which is suitable for receiving RF signals in a very large frequency range, particularly RF radio and television broadcast signals.

In said receiver according to the invention, the combination of the first Cordic and the sawtooth generator can be used as part of a demodulation circuit to which an intermediate frequency (IF) signal at a fixed IF carrier frequency is applied, for example, from a tuning circuit. The repetition frequency of the sawtooth generator is then to be chosen at a suitable fixed value, for example, a value which is equal to the last-mentioned IF carrier frequency.

However, it is alternatively possible to use the combination constituted by the first Cordic and the sawtooth generator as an RF tuning circuit. A preferred embodiment of a receiver according to the invention is therefore characterized in that the repetition frequency of the periodical digital sawtooth-shaped phase signal is variable in a range which corresponds to the frequency reception range of the receiver.

For a direct conversion of a desired RF reception signal to the baseband, such a so-called direct conversion receiver according to the invention is characterized in that the repetition frequency of the periodical digital sawtooth-shaped phase signal of the digital sawtooth generator is equal to said carrier frequency of the analog signal applied to the A/D converter for a direct frequency conversion to the baseband in the computer.

For a conversion of a desired RF reception signal to a fixed IF, such a so-called superheterodyne receiver according to the invention is characterized in that the repetition frequency of the periodical digital sawtooth-shaped phase signal deviates by a fixed intermediate frequency value from said carrier frequency of the analog signal applied to the A/D converter.

A receiver according to the invention is preferably characterized in that the phase rotation caused by the periodical digital sawtooth-shaped phase signal varies linearly over a range of $2\pi$ radials in each period. The occurrence of non-linear distortion is thereby inhibited.

An improved noise behavior is achieved in a further preferred embodiment of a receiver according to the invention which is characterized in that the first sampling frequency is a non-integral number of times the carrier frequency of the analog signal applied to the A/D converter, which number is larger than two.

A further preferred embodiment of a receiver according to the invention is characterized in that the digital demodulation device comprises a second coordinate rotation digital computer (CORDIC) in the vectoring mode, having first and second signal inputs to which the selected phase quadrature signals of the digital filter device at the second sampling frequency are applied, and an output which is coupled to a signal reproducing device.

When using this measure, a signal processing operation is performed in the second coordinate rotation digital computer, hereinafter referred to as second Cordic for short, which is complementary with respect to that in the first Cordic, and a correct demodulation/-conversion is obtained of the selected and sampling frequency-decimated phase quadrature baseband signals into a single-phase signal which comprises the desired baseband information.

In the case of FM RF signals, the last-mentioned single-phase signal becomes available at the phase signal output of the second Cordic and only a signal differentiation is required to obtain the baseband modulation signal. To this end an FM receiver according to the invention is characterized in that said output of the second coordinate rotation digital computer (CORDIC) is the phase signal output and is coupled to the signal reproducing device via a differentiating circuit.

An embodiment of the receiver according to the invention which is suitable for receiving AM RF signals such as, for example, AM radio or AMVSB TV signals is preferably characterized in that said output is a first signal output of the second coordinate rotation digital computer (Cordic) to which an output signal is supplied which varies with the amplitude of the input signals of said second computer, said first signal output being coupled to the signal reproducing device via an amplitude detector.

The first Cordic makes the digital baseband signal in the form of a baseband phase quadrature I and Q signal pair at the first sampling frequency available at said first and second signal outputs.

In order to simplify selection of the I and Q baseband signals, a preferred embodiment of a receiver according to the invention is characterized in that the first coordinate rotation digital computer has a second signal input, while a Hilbert signal transformation is effected between the A/D converter and one of the two signal inputs and a signal delay compensation is effected between the A/D converter and the other signal input.

To realize a correct phase quadrature relationship between the signals at the two signal inputs of the first Cordic, a further preferred embodiment is characterized in that a digital anti-symmetrical finite impulse response filter is incorporated between the A/D converter, on the one hand, and the first and second signal inputs of the first coordinate rotation digital computer, on the other hand, which filter comprises a series arrangement of $2n+1$ ($n=0, 1, \ldots$) serial pairs of delay circuits, the output of each pair of delay circuits as well as the input of the series circuit being coupled to an adder circuit via a weighting factor multiplier circuit, the common connections between the delay circuit of the $(n+1)^{th}$ pair being coupled to the first signal input and the output of the adder circuit being coupled to the second signal input of the first coordinate rotation digital computer.

A digital filter device which can be realized very easily for selecting and decimating the output signals of the first Cordic is characterized in that said digital filter device has a sub-sample filter section which comprises a cascade circuit of an $n^{th}$ order comb filter and an accumulate and dump circuit comprising an adder circuit having first and second signal inputs and a signal output, said first signal input being coupled to an output of the comb filter device and said signal output being coupled to the second signal input via a delay circuit for a signal delay of an input sampling frequency over one period, the output signal of the adder circuit being sampled at an output sampling frequency which is 1/2n the input sampling frequency and the accumulate and dump circuit being reset after each last-mentioned sampling.

The invention will be described in greater detail with reference to the Figures shown in the accompanying drawings which are only given by way of example and in which corresponding elements have the same references.

BRIEF DESCRIPTION OF THE DRAWINGS

In the drawings;

FIG. 4 shows a practical embodiment of a part of the first Cordic in the rotation mode and the sawtooth generator in the circuit of FIG. 2.

DESCRIPTION OF THE PREFERRED EMBODIMENT

Figure 1:
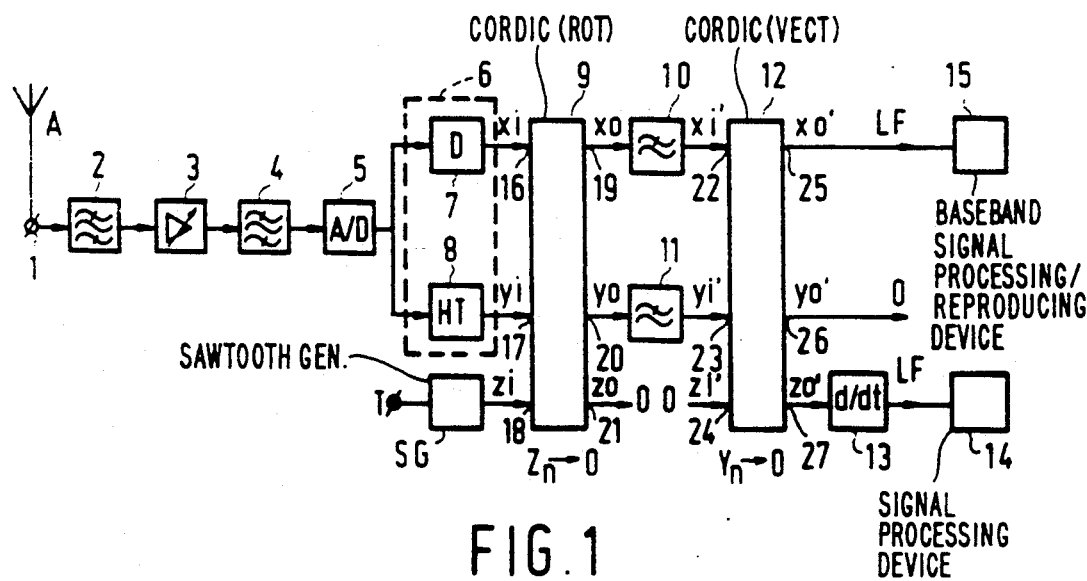
FIG. 1 shows a functional block diagram of a receiver according to the invention of the direct conversion type.

FIG. 1 shows a receiver according to the invention of the direct conversion type, with an antenna input 1 for connecting a radio frequency (RF) antenna device A thereto, to which there are consecutively coupled: a first RF input filter 2, a gain-controlled RF amplifier device 3, a second RF input filter 4, and A/D converter 5, a digital RF filter 6 for converting the RF signals digitized in the A/D converter 5 into digital in-phase (I) and quadrature (Q) RF signals, a first coordinate digital computer (Cordic) 9 in the rotation mode having first and second signal inputs 16 and 17 and a phase signal input 18, first and second signal outputs 19 and 20, and a phase signal output 21, a digital baseband quadrature filter device 10, 11, and a second Cordic 12 in the vectoring mode having first and second signal inputs 22 and 23 and a phase signal input 24 and first and second signal outputs 25 and 26 and a phase signal output 27.

The receiver shown is an FM receiver and to this end it comprises a signal differentiating circuit 13 which is coupled to the phase signal output 27 of the second Cordic, the signal differentiating circuit 13 being connected to a signal processing device 14 for further baseband processing and reproduction.

The first RF filter device 2, the gain-controlled RF amplifier device 3 and the second RF filter device 4 jointly constitute an analog RF input section in which amplitude variations of the RF antenna input signal are adapted to the dynamic range of the A/D converter 5 and in which the RF reception range of the receiver is selected. The gain control signal for the RF gain-controlled amplifier device 3 is supplied by the A/D converter 5. In the A/D converter 5 the RF signals in said RF reception range of the receiver are digitized at a first sampling frequency which should be at least twice the highest frequency in the RF reception range. In a practical embodiment of the receiver shown with an RF reception range between 87.5 MHz and 108 MHz, the first sampling frequency was 350 MHz. The RF reception signals thus digitized are subsequently applied to the digital RF filter 6 for conversion into a pair of phase quadrature RF signals xi and yi which are applied to the first and second signal input 16 and 17, respectively, of the first Cordic 9. A digital anti-symmetrical FIR (Finite Impulse Response) filter which is known per se from, for example, the book "Discrete Time Signal Processing" by A. W. M. van den Enden and N. A. M. Verhoeckx, published by Prentice Hall International (UK) Ltd. in 1989, paragraph 8.2.4, pp. 208–211, can be used as a digital RF filter 6.

The operation of the first Cordic 9 is known per se, for example, from the article "A unified algorithm for elementary functions" by J. S. Walther published in "Spring Joint Computer Conference, 1971", pp. 379 to 385. As is known from this article, a Cordic computes in the rotation mode, like the first Cordic 9, the cartesian coordinates of a signal vector xo and yo obtained by rotating an input signal vector formed by the input phase quadrature signals xi and yi at the first and second signal inputs 16 and 17 of the first Cordic 9 through a phase angle Zo which is applied to the first phase signal input 18 of this first Cordic 9. Since the first Cordic 9 is operative in the rotation mode, a fixed signal value is supplied to the phase signal output 21, which value is equal to 0 or, within a given tolerance deviation, is equal to 0 and which will hereinafter be briefly referred to as the zero value. Each of the circuits 2–13 mentioned so far is known per se and, apart from their respective functions, need not be further described to understand the invention.

According to the invention, the receiver shown comprises a digital sawtooth generator SG which is coupled to the phase signal input 18 of the first Cordic 9. A digital tuning data ft is applied to the digital sawtooth generator SG via a tuning signal input T.

The digital sawtooth generator SG supplies a digital phase angle value Zo to the phase signal input 18 of the first Cordic 9, which value varies periodically in such a way that the successive digital values of the phase angle Zo can be considered to be successive signal samplings of a periodical digital sawtooth-shaped phase signal z having a phase rotation of $2\pi$ rad/period. In other words, the phase angle value Zo varies in each period of the phase signal z while it monotonically increases or decreases over a range of $2\pi$ radial. The repetition frequency of the phase signal z is adjusted at a desired value by means of the digital tuning data ft. The first Cordic 9 consequently operates as a digital quadrature mixer stage in which a frequency conversion or shift is effected over a frequency which is equal to the repetition frequency of said periodical digital sawtooth-shaped phase signal. In a receiver of the direct conversion type the repetition frequency of the phase signal is chosen to be equal to the RF carrier frequency of the desired RF reception signal. The output signals xo and yo at the first and second signal outputs 19 and 20 of the first Cordic 9 thus constitute a pair of baseband phase quadrature signals.

As already mentioned hereinbefore, the variable digital tuning data ft, with which the repetition frequency of the sawtooth-shaped phase signal z can be varied over a desired frequency range, is applied to the sawtooth generator SG via a tuning control input T. For a direct conversion in the first Cordic 9 the variation range of the repetition frequency of the phase signal z should correspond to the RF reception range of the receiver. The baseband phase quadrature signal xo, yo is subsequently applied to the digital baseband phase quadrature filter device 10, 11 in which the baseband phase quadrature signals xo and yo are selected and in which the sampling frequency is decimated or decreased from said first value fs1 to a second value fs2 resulting in a baseband phase quadrature signal x'i, y'i. Such a digital baseband phase quadrature filter device 10, 11 is known per se, for example, from European Patent Application EP 35166 and includes a selective low-pass filter which is operative for the two baseband phase quadrature signals xo and yo, as well as a decimating or sub-sample low-pass filter for decimating the sampling frequency from fs1 to fs2.

Figure 6:
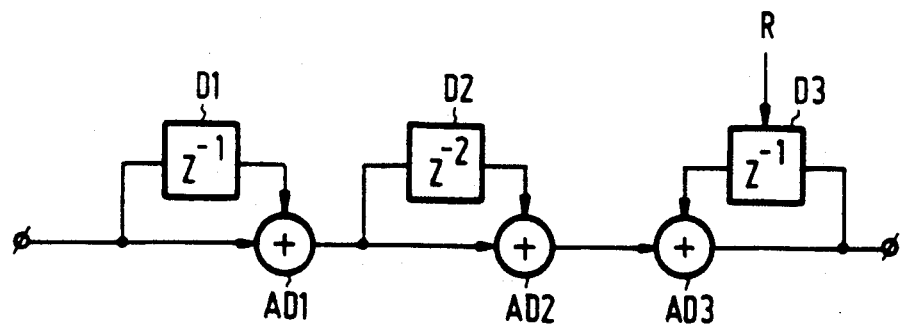
FIG. 6 shows a block diagram of a digital sub-sample filter for use in the digital baseband quadrature filter device of the receiver of FIG. 1.

If the receiver is an FM broadcast receiver, a sub-sample filter as is shown in FIG. 6 is preferably used for each one of the baseband phase quadrature signals xo and yo. In a practical embodiment of such an FM broadcast receiver the last-mentioned sub-sample filter is succeeded by a wave digital filter (not shown) as is known per se from the article "Wave digital filters: Theory and Practice" by A. Fettweis, Proceedings of the IEEE, vol. 74, no. 2, February 1986 in which a further selection and decimation takes place.

If the receiver is a TV receiver, an asymmetrical polyphase filter as is known per se from U.S. Pat. No. 4,914,408 is preferably used in combination with a sub-sample filter adapted thereto for said selective low-pass filter.

The baseband phase quadrature signal x'i, y'i thus obtained in the second sampling frequency fs2 is applied to the first and second signal inputs 22 and 23 of the second Cordic 12 which operates in the vectoring mode. As is known from the above-mentioned publication by Walther, a conversion from a cartesian signal representation to a polar signal representation takes place in the second Cordic 12 because it operates in the vectoring mode, and it is possible to determine the angle and angle variations of an input signal vector such as, for example, x'i, y'i with respect to a fixed reference coordinate, for example, the X axis. In this vectoring mode the phase signal input 24 of the second Cordic 12 conveys the zero value and a zero value level is supplied to the second signal output 26 of the Cordic 12. In the case of an FM receiver the angle modulation of the FM reception signal is obtained at the phase signal output 27 of the second Cordic and this angle should be differentiated. This is effected in the signal differentiating circuit 13 at whose output the desired FM modulation signal in the baseband becomes available. Subsequently, a further signal processing such as, for example, a D/A conversion and reproduction is effected in the signal processing device 14.

As can be deduced from the above-mentioned publication by Walther, the amplitude or absolute magnitude of the input signal vector x3, y3 applied to the first and second signal inputs of the second Cordic 12 is obtained at the first signal output 25 of this Cordic. Consequently it is possible to render the receiver shown easily suitable for receiving amplitude-modulated (AM) RF reception signals by coupling the first signal output 25 of the second Cordic 12 to a baseband signal processing and reproducing circuit 15 or by connecting it to the signal processing device 14 via a switch (not shown).

It is alternatively possible to use the quadrature mixer stage constituted by the first Cordic 9 in combination with the sawtooth generator SG for a fixed frequency conversion of an intermediate frequency (IF) signal of a superheterodyne receiver. To this end such a superheterodyne receiver (not shown) may comprise an analog tuning circuit which is incorporated between the RF input section 2, 3, 4, on the one hand, and the A/D converter 5, on the other hand, or it may comprise a digital quadrature tuning circuit which is known from said European Patent Specification 35166, this circuit replacing or preceding the digital RF filter 6. The repetition frequency of the sawtooth-shaped phase signal z supplied by the sawtooth generator SG should then correspond to the sum or the difference of the desired RF carrier frequency and the intermediate frequency of the superheterodyne receiver. It stands to reason that the intermediate frequency can be chosen at a value which is above the RF reception frequency range (for example, in the case of a double superheterodyne receiver in which a high first intermediate frequency and a lower second intermediate frequency are used) or which is below this range.

It is to be noted that the phase split, which is realized in the digital RF filter 6 to obtain a pair of phase quadrature signals, is not essential for the use of the invention. The supply of phase quadrature signals xi, yi to the signal inputs 16 and 17 of the first Cordic 9 prevents the occurrence of mixed sum components, or mixing products at the signal outputs 19 and 20, which are located at the sum frequency of the carrier frequency of the last-mentioned phase quadrature signals xi, yi and the repetition frequency of the phase signal z. Consequently, the selection of the desired mixed difference components in the digital baseband phase quadrature filter 10, 11 is simplified to a considerable extent.

The digital RF filter 6 can be dispensed with by imposing stricter selectivity requirements on the last-mentioned baseband phase quadrature filter 10, 11. The digitized RF reception signal of the output of the A/D converter 5 can then be applied directly to one of the two signal inputs 16 and 17, while the other signal input is connected to a zero value level.

Figure 2:
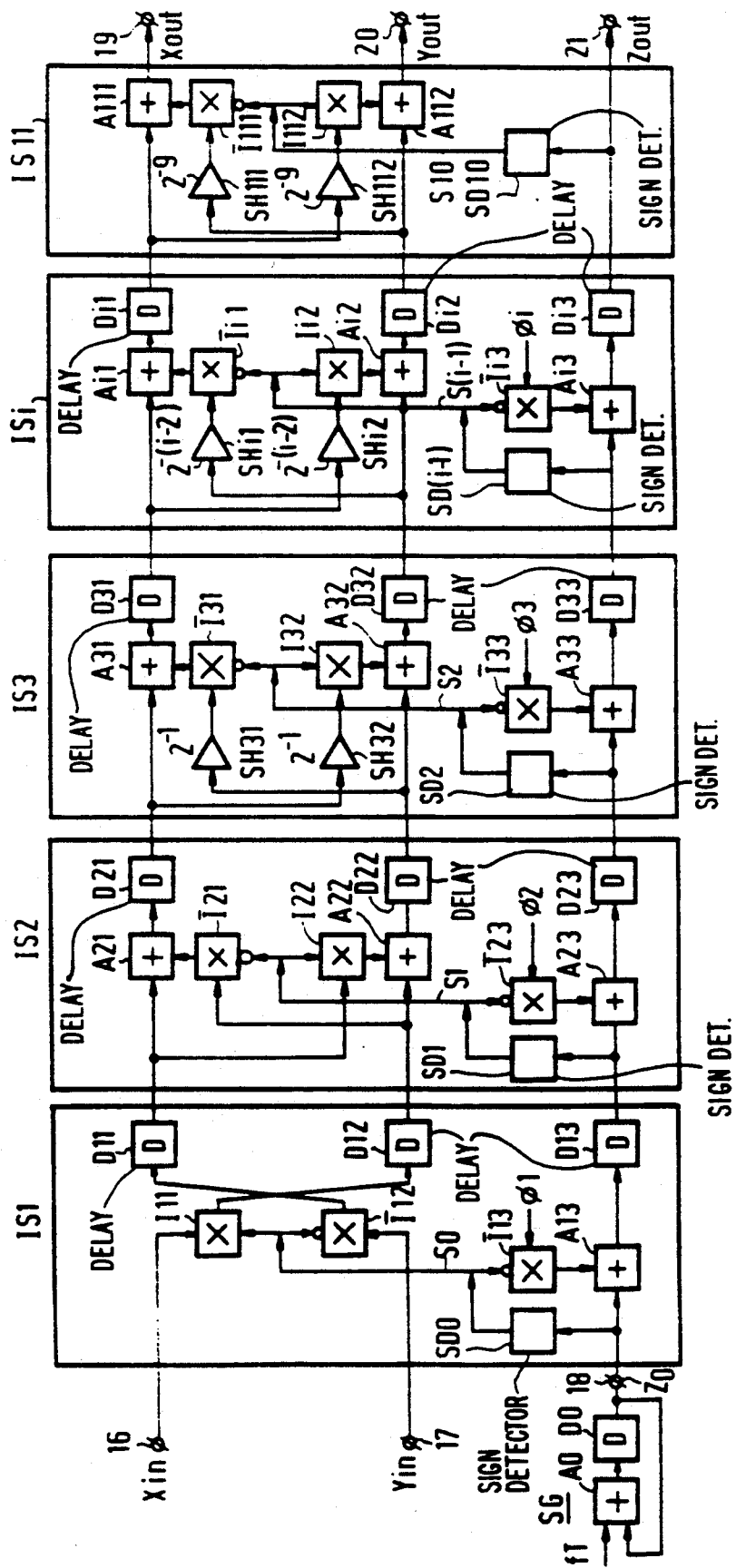
FIG. 2 shows a functional block diagram of a sawtooth generator in combination with a Cordic in the rotation mode for use in a block diagram of the receiver of FIG. 1.

FIG. 2 shows a functional block diagram of the digital quadrature mixer stage constituted by the first Cordic 9 and the sawtooth generator SG according to the invention. In the version shown this stage comprises a cascade circuit of eleven iteration sections IS1 to IS11 in which one of eleven consecutive iterative angle convergence steps is performed. As is known from the above-mentioned article by Walther, the associated changes in the signal values of the signal or signals applied to the signal input 16 and/or the signal input 17 are defined for each iteration step in the sections IS2 to IS11 by the following equations:

$$X(j+2) = X(j+1) - \text{sign } Z(j+1)*2^{-j}*Y(j+1)$$

$$X(j+2) = Y(j+1) + \text{sign } Z(j+1)*2^{-j}*X(j+1)$$

$$Z(j+2) = Z(j+1) - \text{sign } Z(j+1)*\text{arc tan } 2^{-j}$$

with $j = 0 \ldots 9$ for a given choice of the angle convergence.

For the section IS1 it holds that:

$$X1 = -\text{sign } Zo*Yo$$

$$Y1 = \text{sign } Zo*Xo$$

$$Z1 = Zo - \text{sign } Zo*\pi/2$$

The references Xo and Yo denote the sampling values of xi and yi, respectively, and sign Zo denotes the sign of the sampling value Zo of z.

In a so-called z branch of the sections IS1 to IS11, which will hereinafter be described in greater detail, the input angle value Zo is rotated iteratively via a series of fixed converging angles (see Table I below) towards zero or at least towards a residual value deviating therefrom within the tolerance deviation. For each iteration section the sign, or the direction of the fixed rotation angle is defined with which the desired angle convergence is obtained. In the first iteration section IS1, $\pi/2$ is added to Zo or subtracted from Zo in dependence on the sign of Zo, resulting in a new angle value Z1.

In the second iteration section IS2 $\pi/4$ is added to Z1 or subtracted from Z1 in dependence on the sign of Z1, resulting in Z2 such that Z2<Z1, etc., etc.

The Table below shows through which angles the input angle value Zo is successively rotated in the consecutive iteration sections. It is based on a 12-bit representation in so-called two's complement mode, in which $2^{12}=4096$ corresponds to $2\pi$.

TABLE I

| $\phi$ | RAD | | RAD | DEG | DEC | + BIN | − BIN |
|---|---|---|---|---|---|---|---|
| 1 | 2*arctan(2 | 0) | 1.570796327 | 90 | 1024 | 010000000000 | 110000000000 |
| 2 | arctan(2 | 0) | 0.785398163 | 45 | 512 | 001000000000 | 111000000000 |
| 3 | arctan(2 | −1) | 0.463647609 | 26.6 | 302 | 000100101110 | 111011010010 |
| 4 | arctan(2 | −2) | 0.244978663 | 14.0 | 160 | 000010100000 | 111101100000 |
| 5 | arctan(2 | −3) | 0.124354995 | 7.1 | 81 | 000001010001 | 111110101111 |
| 6 | arctan(2 | −4) | 0.062418810 | 3.6 | 41 | 000000101001 | 111111010111 |
| 7 | arctan(2 | −5) | 0.031239833 | 1.8 | 20 | 000000010100 | 111111101100 |
| 8 | arctan(2 | −6) | 0.015623729 | 0.9 | 10 | 000000001010 | 111111110110 |
| 9 | arctan(2 | −7) | 0.007812341 | 0.4 | 5 | 000000000101 | 111111111011 |
| 10 | arctan(2 | −8) | 0.003906230 | 0.2 | 3 | 000000000011 | 111111111101 |
| 11 | arctan(2 | −9) | 0.001953123 | 0.1 | 1 | 000000000001 | 111111111111 | with:
RAD=radial,
DEG=degree,
DEC=decimal,
BIN=binary.

In the embodiment shown it is checked in the first iteration section IS1 whether the digital 12-bit angle value Zo has a positive or a negative sign. To this end the first iteration section IS1 comprises a sign detector SD0 which is coupled to the phase signal input 18 and which detects the sign of the angle value Zo, i.e. starting from a two's complement representation it defines the bit value of the most significant bit in the angle value Zo. The sign detector SD0 is coupled to control inputs of an inverter circuit I11, an inverter circuit $\bar{I}12$ which is complementary thereto and an inverter circuit $\bar{I}13$ which is also complementary. An inverter circuit is hereinafter understood to mean a circuit which multiplies an input signal by the control signal, i.e. it does not invert the input signal when the control signal is +1 and it inverts this signal when the control signal is −1. A complementary inverter circuit works the other way round: signal inversion at a +1 control signal and no signal inversion at a −1 control signal. Signal inputs of I11 and $\bar{I}12$ are connected to first and second signal inputs 16 and 17, respectively, of the first Cordic 9, while a signal input of $\bar{I}13$ is coupled to a fixed angle rotation value $\phi1$ corresponding to an angle value of 90° as is indicated on the top line of the Table above. A signal output of $\bar{I}13$ is coupled to a first signal input of an adder A13, while a second signal input of A13 is coupled to the phase signal input 18. Signal outputs of I11, $\bar{I}12$ and A13 are coupled to delay circuits D12, D11 and D13, respectively.

If the most significant bit in the angle value Zo at the phase signal input 18 is positive, the sign of the signal sample Yo of the signal input 17 is inverted in the inverter circuit $\bar{I}12$, whereafter it is stored as a new signal sample Y1 in the delay circuit D11, while the signal sample Xo at the first signal input 16 is stored in the delay circuit D12 as the new signal sample X1 with the same sign. An opposite sign inversion is effected when the last-mentioned most significant bit in Zo is negative. The circuits SD0, $\bar{I}13$ and A13 constitute the so-called z branch of the iteration section IS1. Not only the sign of the rotation step required for the afore-mentioned processing of the samples Xo and Yo but also a signal processing corresponding to a rotation of the angle value Z1 through 90° towards the zero value, for example, 0, resulting in $Z1=Zo\pm90°$ is obtained. By representing the angle value in a so-called two's complement form, it will be possible to simplify the circuits required for the angle convergence to a considerable extent and to reduce their size, as will hereinafter be explained in greater detail. The signal processing operations in the first iteration section IS1 described so far are effected in one sampling period, for example, ts1. In a subsequent sampling period ts2 corresponding signal processing operations are performed, starting from the new sample values X1 and Y1 and the new angle value Z1.

In the second iteration section IS2, the most significant bit value of the angle word stored in D13 is detected in a sign detector SD1 in the last-mentioned sampling period ts2. An output of SD1 is connected to control inputs of an inverter circuit I22 and inverter circuits $\bar{I}21$ and $\bar{I}23$ which are complementary thereto. Signal inputs of I22 and $\bar{I}21$ are connected to outputs of D11 and D12, respectively, while a signal input of $\bar{I}23$ is connected to a fixed angle rotation value $\phi2$ corresponding to an angle value of 45°. Signal outputs of $\bar{I}21$, I22 and $\bar{I}23$ are connected to adder circuits A21, A22 and A23, respectively. First signal inputs of A21, A22 and A23 are connected to the signal outputs of D11, D12 and D13, respectively. Signal outputs of A21, A22 and A23 are coupled to delay circuits D21, D22 and D23, respectively.

Dependent on the sign or the value of the most significant bit in the angle value Z1, which is supplied from D13 to the z branch (SD1, $\bar{I}23$ and A23) of the second iteration section S2, the signal of the X1 and Y1 signal samples supplied by D11 and D12, respectively, is inverted in the complementary circuit $\bar{I}21$, followed by an addition in A21 and A22 with the original value of these signals. The results of these additions are stored as signal samples X2 and Y2 in the delay circuits D21 and D22, respectively. In the last-mentioned z branch an angle iteration step is performed again with the aid of the complementary inverter circuit $\bar{I}23$ and the adder circuit A23, this time through an angle of $\pi/4$ in such a direction that the now new angle value Z2 at the output of A23 is smaller than Z1. This new angle value Z2 is subsequently stored in the delay circuit D23.

In a subsequent sampling period ts3, the contents of the delay circuits D21, D22 and D23 are applied as input signal sample for the third iteration section IS3, which has mainly the same circuit configuration as the second iteration section IS2. The third iteration section IS3 comprises a sign detector SD2 an input of which is coupled to an output of the delay circuit D23 and a signal output of which is coupled to control inputs of an inverter circuit I32 and inverter circuits $\bar{I}31$ and $\bar{I}33$ which are complementary thereto. Outputs of the delay circuits D21 and D22 are coupled to first signal inputs of adder circuits A31 and A32, respectively, and to signal inputs of I32 and Ī31 via shift registers SH32 and SH31 functioning as divide-by-two circuits. Signal outputs of Ī31 and I32 are coupled to second signal inputs of the adder circuits A31 and A32, respectively. Signal outputs of A31 and A32 are subsequently coupled to signal inputs of delay circuits D31 and D32, respectively. A fixed binary value corresponding to an angle value $\phi 3$ is applied to a signal input of the complementary inverter circuit Ī33. Together with the signal output of D23, the signal output of Ī33 is applied to an adder circuit A33 whose signal output is connected to a signal input of a delay circuit D33.

In a corresponding manner an iteration section ISi (i=4 through 11) incorporates inverter circuits Ii2 and inverter circuits Īi1, Īi3 which are complementary thereto, in combination with adder circuits Ai2, Ai1 and Ai3 as well as a sign detector SD(i−1) and shift registers SHi1 and SHi2. A division by a factor of $2^{-(i-2)}$ is obtained with the shift registers SHi1 and SHi2. The adder circuits Ai1, Ai2 and Ai3 are coupled to signal inputs of delay circuits Di1, Di2 and Di3, respectively. A signal input of the complementary inverter circuit Ii3 is connected to a fixed binary value corresponding to an angle value $\phi i$.

The last iteration section IS11 only performs computations with reference to the angle value Zo obtained in the penultimate section IS10, which value coincides with zero within a deviation determined by the least significant bit in the angle value word. In the last iteration section IS11, no further angle convergence of Z10 is performed so that the circuits corresponding to Īi3 and Ai3, as well as the delay circuits corresponding to Di1, Di2 and Di3 are dispensed with.

According to the invention the varying angle value Zo is obtained at the phase signal input 18 by means of a sawtooth generator SG. In the version shown this generator comprises an adder circuit A0 with first and second signal inputs and a signal output which is coupled to a signal delay circuit D0, a signal output of which is coupled to the phase signal input 18 of the first Cordic 9 as well as to a second signal input of the adder circuit A0. A variable digital tuning data ft is applied to the first signal input of the adder circuit A0. By a suitable numerical value of the digital tuning data ft with respect to the maximum count of the adder circuit A0, a periodical sawtooth-shaped signal is obtained with angle sampling values Zo at the phase signal input 18 in a repetition frequency which corresponds to the RF carrier frequency of the desired Rf reception signal.

Figure 3:
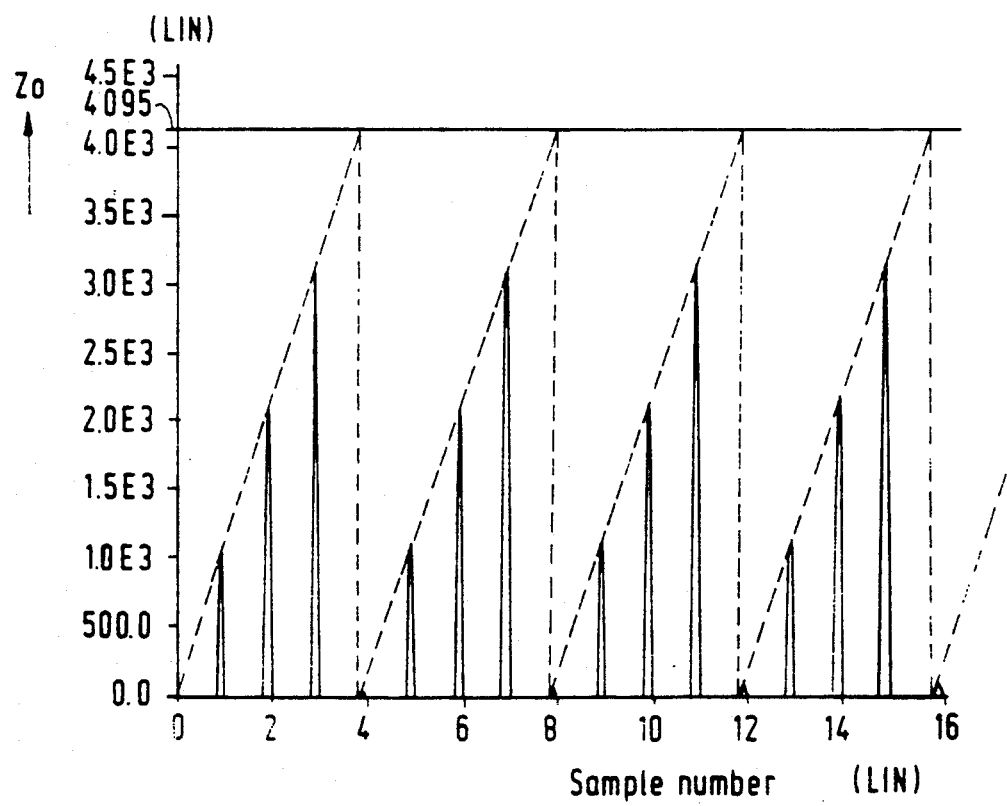
FIG. 3 shows the time-dependent variation of the sawtooth-shaped phase signal of the sawtooth generator in the receiver of FIGS. 1 and/or 2.

FIG. 3 shows the successive sampling values of a periodical sawtooth-shaped phase signal z which is obtained in a practical embodiment of a sawtooth generator as is shown in FIG. 2. In this practical embodiment the counting range of the adder circuit A0 is between 0 and 4095 and the maximum count is thus 4095. The numerical value of the digital tuning data is 1031. The Table II below states how the numerical value of the successive samplings or angle values at the phase signal input 18 varies as a function of time.

TABLE II

| sample | |
|---|---|
| 1 | 0 |
| 2 | 1031 |
| 3 | 2062 |
| 4 | 3093 |
| 5 | 28 (4124−4096) |
| 6 | 1059 |
| 7 | 2090 |

TABLE II-continued

| sample | |
|---|---|
| 8 | 3121 |
| 9 | 56 (4152−4096) |
| 10 | 1087 |
| 11 | 2118 |
| 12 | 3149 |
| 13 | 84 (4180−4096) |
| 14 | 1115 |
| 15 | 2146 |
| 16 | 3177 |
| 17 | 112 (4208−4096) |

Since the maximum count of the adder circuit A0 is a non-integral number of times the numerical values of the digital tuning data, the sampling instants for each sawtooth period shift in phase with respect to the repetition period of the sawtooth. This phase shift results in a frequency spread of the noise so that the noise behaviour of the quadrature mixer stage constituted by the first Cordic 9 and the sawtooth generator SG is considerably improved.

The embodiment shown in FIG. 2 has a so-called pipeline structure because use is made of delay circuits Di1, Di2 and Di3 (i=1 ... 11). This provides the possibility of performing the consecutive iterations at a clock frequency which is equal to the first sampling frequency. However, it is possible to dispense with the delay circuits Di1, Di2 and Di3. A serial iterative angle convergence in a sampling frequency which is smaller than the clock frequency by a factor equal to the number of iteration sections is then obtained.

FIG. 4 shows a practical implementation of the sawtooth generator SG in combination with the z branch in the cascade circuit of the first to tenth iteration sections IS1 to IS10. Starting from a 12-bit angle value representation, the sawtooth generator SG should comprise twelve parallel accumulator circuits each corresponding to the circuit constituted in FIG. 2 by the adder circuit A0 and the delay circuit D0 and the feedback from the output of the delay circuit D0 to the second signal input of the adder circuit A0. If the accumulator circuit for the least significant bit is referred to as AC1 and that for the least significant bit but one is referred to as AC2, and so forth to AC12 for the accumulator circuit for the most significant bit, the respective circuits AC1 to AC11 should have their carry-out outputs connected to carry-in inputs of the accumulator circuits AC1 to AC12. Signal outputs of the accumulator circuits AC1 to AC11 are connected to delay circuits D131 to D1311, respectively, with a signal inversion being effected in the signal path of the accumulator circuit AC11.

In the case of a two's complement angle value representation as indicated in the Table above, the sign bit S0 for the iteration section IS1 is obtained at the output of the accumulator circuit AC12. The sign bit S1 for the iteration section IS2 is obtained by inverting the output signal of the accumulator circuit AC11 and delaying it over one sampling period in the delay circuit D1311. Also the sign bit S2 for the third iteration section IS3 is solely determined by the output signal of the accumulator circuit AC10.

Signal outputs of the delay circuits D131 to D1310 are connected to signal inputs of delay circuits D231 to D2310, respectively. A signal inversion is effected in the signal path of the accumulator circuit AC10 and the delay circuit D2310 supplies the sign bit S2 to the third iteration section IS3. Outputs of the delay circuits D233 to D239 are connected to signal inputs of first signal inputs of seven adder circuits A233 to A239. The sign bit S2 is applied to second signal inputs of the adder circuits A233, A234, A236 and A239, while the inverted value of the sign bit S2 is applied to the other adder circuits. The adder circuits A233 to A239 are interconnected through a carry-bit coupling, while a carry-bit input of the adder circuit A233 is coupled to the delay circuit D232. The carry-bit output signal of the adder circuit A239 is applied as sign bit S3 to the fourth iteration section IS4 after inversion and delay in a delay circuit D3310. Signal outputs of the adder circuits A233 to A239 are coupled to signal inputs of delay circuits D333 to D339, respectively. Signal outputs of the delay circuits D231 and D232 are coupled to delay circuits D331 and D332, respectively.

For the formation of the fourth sign bit S4, use is made of three adder circuits A337 to A339, first signal inputs of which are coupled to signal outputs of delay circuits D337 to D339, while a second signal input of the adder circuit A338 receives the sign bit S3 and second signal inputs of the adder circuits A337 and A339 receive the inverse value of the sign bit S3. The adder circuits A337 to A339 are interconnected via a carry-bit coupling, while a carry-bit input of the adder circuit A337 is connected to an output of the delay circuit D336. The carry-bit output signal of the adder circuit A339 is applied as sign bit S4 to the fifth iteration section IS5 after inversion and delay in a delay circuit D4310. Signal outputs of the delay circuits D331 to D336 and of the adder circuits A337 to A339 are coupled to delay circuits D431 to D439, respectively.

The sign bit S5 for the sixth iteration section IS6 is obtained by means of eight adder circuits A434 to A439, first inputs of which are coupled to delay circuits D432 to D439, respectively. The input signals of the adder circuits A432 and A436 are inverted. The sign bit S4 is applied to second signal inputs of adder circuits A435 and A437, while the inverse value of the sign bit S4 is applied to the other adder circuits of said group of eight adder circuits A432 to A439. The adder circuits A432 to A439 are interconnected via a carry-bit coupling. The carry-bit input of the adder circuit A432 is connected to an output of the delay circuit D431. Signal outputs of the delay circuit D431 and the adder circuits A432 to A439 are coupled to delay circuits D531 to D539, respectively. An output of the delay circuit D539 supplies the sign bit S5 for the sixth iteration section IS6.

For forming the sign bit S6 for the seventh iteration section IS7, use is made of seven adder circuits A532 to A538, first signal inputs of which are coupled to delay circuits D532 to D538, respectively, while second signal inputs of the adder circuits A534 and A536 receive the sign bit S5. The inverse value of the sign bit S5 is applied to second signal inputs of the other adder circuits. Also these adder circuits A532 to A538 are interconnected via a carry-bit coupling, while a carry-bit input of the adder circuit A532 receives the inverse value of the output signal of the delay circuit D531. Signal outputs of the delay circuit D531 and the adder circuits A532 to A538 are connected to delay circuits D631 to D638, respectively. The output signal of the delay circuit D638 is applied as sign bit S6 to the seventh iteration section IS7.

For forming the sign bit S7 for the eighth iteration section IS8 use is made of four adder circuits A634 to A637, first inputs of which are coupled to outputs of the delay circuits D634 to D637, while a second signal input of the adder circuit A635 receives the sign bit S6. The inverse value of the sign bit S6 is applied to second signal inputs of the other adder circuits A634, A636 and A637. The adder circuits A634 to A637 are interconnected via a carry-bit coupling. The delay circuit D642 is coupled to a carry-bit input of the adder circuit A634. Signal outputs of the delay circuits D631 to D633 and adder circuits A634 to A637 are coupled to delay circuits D731 to D737, respectively. The sign bit S7 is obtained at the output of the delay circuit D737.

For forming the sign bit S8 for the ninth iteration section IS9 use is made of four adder circuits A733 to A736. First signal inputs of the adder circuits A733 to A736 are coupled to delay circuits D733 to D737, respectively. A signal inversion is effected at the first signal input of the adder circuit A733. A second signal input of the adder circuit A734 receives the sign bit S7, while second signal inputs of the adder circuits A733, A735 and A736 receive the inverse value of the sign bit S7. The adder circuits A733 to A736 are interconnected via a carry-bit coupling, while a carry-bit input of the adder circuit A733 is coupled to an output of the delay circuit D732. The delay circuits D731, D732 and the adder circuits A733 to A736 are connected to delay circuits D831 to D836, respectively. The delay circuit D836 supplies said sign bit S8.

For forming the sign bit S9 for the tenth iteration section IS10, use is made of four adder circuits A832 to A835, signal inputs of which are coupled to outputs of the delay circuits D832 to D835. A signal inversion is effected at the first signal input of the adder circuit A832. A second signal input of the adder circuit A833 receives the sign bit S8, while second signal inputs of the adder circuits A832, A834 and A835 receive the inverse value of the sign bit S8. The sign bit S9 for the iteration section S10 is subsequently derived from the output signal of the adder circuit A835 via a delay circuit D935.

The circuit shown in FIG. 4 and described hereinbefore comprises a minimum number of circuit components with which the functions of the sawtooth generator SG and the z branch in FIG. 2 required for generating the sign bits S0 to S10 are realized. This is possible by choosing the $\phi$ values in the iteration sections IS1 to IS10 in accordance with the Table I above. As already stated hereinbefore, the angle value Zo supplied by the sawtooth generator SG is iteratively rotated to a residual or zero value. For each iteration section the variation range of Zi decreases. Thus, it is not necessary to pass on all bit values at the side of the most significant bit from the output to a subsequent iteration section. As a result the word width of the angle value z in which variations may occur decreases for each iteration section. This yields a first economy of circuit components. Optimum use is further made of so-called wiring logic techniques, or realizing logic functions by means of suitably chosen through-connections.

Figure 5:
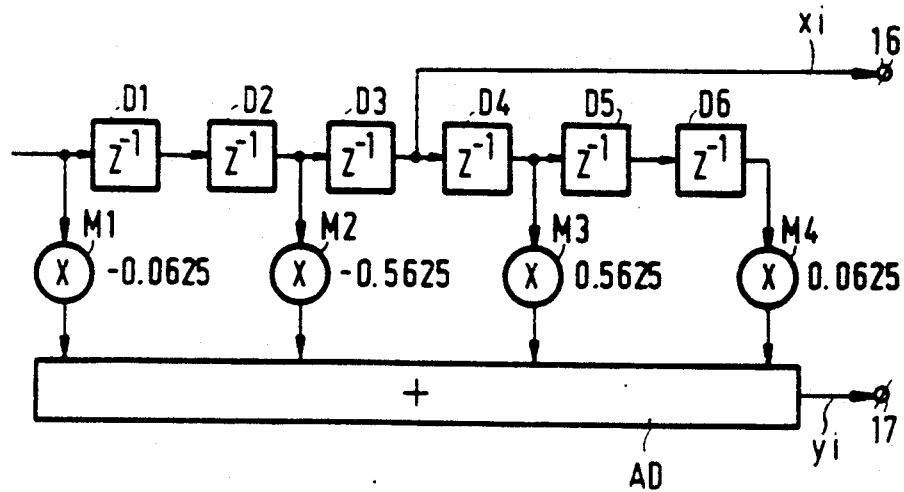
FIG. 5 shows a block diagram of a Hilbert transformation circuit.

FIG. 5 shows a block diagram of a practical embodiment of the RF digital filter 6 in which the digital RF signal at the output of the A/D converter 5 is split in phase into a pair of phase quadrature RF signals xi and yi. The RF digital filter shown is a so-called anti-symmetrical FIR (Finite Impulse Response) filter and is provided with a series circuit of six delay circuits D1 to D6, the input of D1 and the outputs of D2, D4 and D6 being coupled to multiplier circuits M1 to M4, respectively. Outputs of these multiplier circuits are connected to inputs of an adder circuit AD. The input sampling value of the cascade circuit and the output sampling value of the delay circuits D2, D4 and D6 are multiplied by means of the multiplier circuits M1 to M4 by fixed weighting factors which are pairwise mirrored with respect to 0 and are −0.0625; −0.5625; 0.5625; 0.0625, respectively. Starting from a digital RF input signal at the common input of M1 and D1 the digital filter shown applies a digital RF signal xi to the output of D3, which signal is applied to the first signal input 16 of the first Cordic 9 and is in an accurate phase quadrature relationship with the output signal of the adder AD which is applied as RF digital signal yi to the second signal input of the first Cordic 9. The signal delay which occurs between the input of the filter and the output of D3 is equal to the signal delay between said input and the output of the adder circuit AD.

It is possible to use an anti-symmetrical digital filter of an order which is higher than that of the one shown, for which it generally holds that such a filter is provided with a series circuit of $2n+1$ ($n=0, 1 \ldots$) serial delay circuits, the output of each pair of delay circuits as well as the input of the series circuit being coupled to an adder circuit via a weighting factor multiplier circuit, while the common connection between the delay circuit of the $(n+1)^{th}$ pair is coupled to the first signal input and the output of the adder circuit is coupled to the second signal input of the first Cordic 9.

However, it is very well possible to perform the combined functions of signal delay compensation and Hilbert transformation separately by means of the digital filter shown, i.e. by means of mutually separated circuits. As stated hereinbefore, such a circuit can be dispensed with by adapting the selectivity after the first Cordic and the output signal of the A/D converter can be directly applied to either the first signal input 16 or the second signal input 17 of the first Cordic 9.

FIG. 6 shows a sub-sample or decimating low-pass filter section for use in each of the filters 10 and 11 of the digital filter device 10, 11 of the receiver of FIG. 1.

The filter section shown comprises a cascade circuit of a first-order comb filter D1, AD1, a second-order comb filter D2, AD2, an accumulation and dump circuit D3, AD3 provided with adder circuits AD1, AD2 and AD3, respectively, each with first and second signal inputs and a signal output. The first signal input of AD1 constitutes a signal input IN of the filter section and is coupled to the second signal input of AD1 via a delay circuit D1, while the signal output of AD1 is connected to the first signal input of AD2 and to the second signal input of AD2 via a delay circuit D2, the signal output of AD2 is connected to a first signal input of AD3 and the signal output of AD3 is connected to the second signal input of AD3 via a delay circuit D3 and also constitutes a signal output OUT of the filter section. The comb filter D1, AD1 and D2, AD2 is of the first and second order, respectively, because D1 and D2 realize a signal delay over one period and two periods, respectively, of the sampling frequency fsi of the input signal applied to IN. Likewise as D1, the delay circuit D3 realizes a signal delay over one period of fsi and is preferably realized by means of a resettable memory circuit.

The output signal of the accumulation and dump circuit AD3, D3 is sampled at an output sampling frequency fso in which, for example, fso=¼ fsi, while directly after each output signal sampling D3 the entire accumulation and dump circuit AD3, D3 is thus reset.

As a result a sampling frequency reduction or a decimation by a factor of 4 is effected. Simultaneously a selectivity is realized which is comparable with that of a time-invariant filter having a transfer of $H(z)=(1+z^{-1})(1+z^{-2})$. No sampling frequency decimation is effected in such a time-invariant filter, while the realization of such a filter requires considerably more components than the accumulation and dump circuit D3, AD3.

To prevent noise and other unwanted interference components from aliasing as a result of the decimation in the accumulation and dump circuit AD3, D3 in the frequency band of the useful signal, these unwanted interference components are firstly suppressed by means of the comb filters AD1, D1 and AD2, D2 in a sufficiently wide cut-off range around the zeros in the filter transfer. The comb filters AD1, D1 and AD2, D2 jointly have a transfer which is equal to $(1+z^{-1})$ and $(1+z^{-2})$.

In a practical embodiment of the receiver of FIG. 1 as a directly mixing FM receiver suitable for receiving RF-FM signals in a range between 87.5 and 108 MHz, a first sampling frequency fsi of 350 MHz was chosen in connection with avoiding a 3rd harmonic interference in the desired signal at the A/D conversion in the A/D converter 5 and obtaining a simple realization of the digital RF quadrature filter 6.

For each of the two phase quadrature baseband signals xo and yo at the outputs 19 and 20 of the first Cordic 9 a cascade circuit of three filter sections of the type shown in FIG. 6 and described hereinbefore was used, while a first-order and a second-order comb filter corresponding to D1, AD1 and D2, AD2 (not shown) were added as extra components to the third and last filter section in the cascade circuit. An extra suppression of the unwanted interference components and a comparatively small decrease of the number of circuit elements was obtained with these extra comb filters. A decimation factor of $4^3=64$ was obtained with the last-mentioned cascade circuit of filter sections, so that starting from fsi=350 MHz an output sampling frequency of approximately 5.47 MHz was obtained. With this last-mentioned filter section cascade circuit a selectivity was realized which is comparable with that of a time-invariant comb filter having a transfer function of $(1+z^{-1})^2(1+z^{-2})^2(1+z^{-4})^2(1+z^{-8})^2(1+z^{-16})^3(1+z^{-32})^3$, and such a time-invariant comb filter (not shown) should then be succeeded by a decimation device and requires a considerably larger number of circuit components than said filter section cascade circuit.

In the relevant practical embodiment each of the two filter section cascade circuits was succeeded by a selective low-pass filter of the aforementioned "wave digital filter" type at whose output a last sampling frequency decimation by a factor of 5 or 6 can be effected.

The order and the number of comb filters in each filter section is to be chosen in dependence upon the required receiver specifications, the spectral width and location of the desired signal to be filtered and/or the decimation factor. For example, it is very well possible to dispense with one or even with said two comb filters in one or more filter sections, or it may be necessary to add extra comb filters.

We claim:

1. A receiver comprising an A/D converter for digitally sampling an analog signal modulated on a carrier frequency at a first sampling frequency, consecutively coupled to a digital quadrature mixer stage for a carrier frequency shift of the digitized modulated signal from the A/D converter, provided with first and second signal outputs via which the digital quadrature mixer stage supplies a pair of carrier frequency converted phase quadrature signals, a digital filter device for selecting the phase quadrature signals of the quadrature mixer stage and for decimating the sampling frequency from said first sampling frequency to a second sampling frequency, and a digital demodulation device coupled to the output of the digital filter, characterized in that the digital quadrature mixer stage comprises a first coordinate rotation digital computer (Cordic) in the rotation mode, having at least a first signal input which is coupled to an output of the A/D converter and a phase signal input which is coupled to an output of a digital sawtooth generator, which digital sawtooth generator supplies a periodical digital sawtooth-shaped phase signal to the phase signal input of said computer for a periodical $2\pi$ phase rotation of at least the signal applied to the computer via the first signal input at a repetition frequency which is equal to the magnitude of said carrier frequency shift, said computer supplying at the first and second signal outputs said pair of carrier frequency converted phase quadrature signals to the digital filter device.

2. A receiver as claimed in claim 1, characterized in that the repetition frequency of the periodical digital sawtooth-shaped phase signal is variable in a range which corresponds to the frequency reception range of the receiver.

3. A receiver as claimed in claim 1, characterized in that the repetition frequency of the periodical digital sawtooth-shaped phase signal of the digital sawtooth generator is equal to said carrier frequency of the analog signal applied to the A/D converter for a direct frequency conversion in the computer to the baseband.

4. A receiver as claimed in claim 1, characterized in that the repetition frequency of the periodical digital sawtooth-shaped phase signal deviates by a fixed intermediate frequency value from said carrier frequency of the analog signal applied to the A/D converter.

5. A receiver as claimed in claim 1, characterized in that the phase rotation caused by the periodical digital sawtooth-shaped phase signal varies linearly over a range of $2\pi$ radians in each period.

6. A receiver as claimed in any one of the preceding Claims, characterized in that the first sampling frequency is a non-integral number of times the carrierfrequency of the analog signal applied to the A/D converter, which number is larger than two.

7. A receiver as claimed in claim 6, characterized in that the digital sawtooth generator comprises an accumulator circuit which is provided with a cascade circuit of an adder circuit having first and second signal inputs and a delay circuit for a signal delay over one sampling period, an output of the delay circuit being coupled to the phase signal input of the first computer as well as to the second signal input of the adder circuit, a digital tuning data being applied to said first signal input of the adder circuit, the magnitude of said tuning data being variable and being included in the counting range of the adder circuit by a non-integral number of times which is larger than two.

8. A receiver as claimed in claim 1, characterized in that the digital demodulation device comprises a second coordinate rotation digital computer (CORDIC) in the vectoring mode having first and second signal inputs to which the selected phase quadrature signals of the digital filter device at the second sampling frequency are applied, and an output which is coupled to a signal reproducing device.

9. A receiver as claimed in claim 8, for receiving FM signals, characterized in that said output of the second coordinate rotation digital computer (CORDIC) is the phase signal output and is coupled to the signal reproducing device via a differentiating circuit.

10. A receiver for receiving FM signals as claimed in claim 9, characterized by an RF input section coupled between an antenna input and an input of the A/D converter, comprising at least an RF filter device for a bandpass selection mainly between 85 MHz and 110 MHz, an automatically controlled amplifier for adapting the signal dynamic range of the reception signal to the dynamic range of the A/D converter, the first sampling frequency of the A/D converter being of the order of 350 MHz.

11. A receiver as claimed in claim 8 for receiving AM signals, characterized in that said output is a first signal output of the second coordinate rotation digital computer (Cordic) to which an output signal is supplied which varies with the amplitude of the input signals of said second computer, said first signal output being coupled to the signal reproducing device via an amplitude detector.

12. A receiver as claimed in claim 1, characterized in that the first coordinate rotation digital computer has a second signal input, while a Hilbert signal transformation is effected between the A/D converter and one of the two signal inputs and a signal delay compensation is effected between the A/D converter and the other signal input.

13. A receiver as claimed in claim 12, characterized in that a digital anti-symmetrical finite impulse response filter is incorporated between the A/D converter on the one hand and the first and second signal inputs of the first coordinate rotation digital computer on the other hand, which filter comprises a series arrangement of $2n+1$ ($n=0, 1 \ldots$) serial pairs of delay circuits, the output of each pair of delay circuits as well as the input of the series circuit being coupled to an adder circuit via a weighting factor multiplier circuit, the common connections between the delay circuits of the $(n+1)^{th}$ pair being coupled to the first signal input and the output of the adder circuit being coupled to the second signal input of the first coordinate rotation digital computer.

14. A receiver as claimed in claim 7, characterized in that the first coordinate rotation digital computer (Cordic) comprises a cascade circuit of first to $K^{th}$ iteration sections each comprising first and second phase quadrature signal branches and a phase signal branch coupled between the first signal input and output, the second signal input and output and the phase signal input and output of said first computer, said phase signal branch in each of the first to $(k-1)^{th}$ iteration sections comprising a sign detector for detecting the sign of the most significant information bit in the angle value applied to the phase signal branch of the relevant iteration section, as well as an adder circuit to which a fixed rotation angle added to or subtracted from the angle value is applied in dependence upon the last-mentioned sign, said adder circuit of the first to $(k-1)^{th}$ iteration section being coupled to the phase signal branch of the second to $K^{th}$ iteration section, the fixed rotation angle in the first and second iteration sections being 90° and 45°, respectively, and the tangential value of the fixed rotation angles in the 3rd to $(k-1)^{th}$ iteration sections being equal to $2^{-i}$ with $i=1$ to $K-3$.

15. A receiver as claimed in claim 14, characterized in that the angle value and the fixed rotation angle are each represented in a two's complement mode word and in that a binary adder circuit is incorporated in each iteration section only for those bit sites in the angle value word at which the bit value can vary as a result of the addition or subtraction to or from the fixed rotation angle.

16. A receiver as claimed in claim 1, characterized in that said digital filter device has a sub-sample filter section which comprises a cascade circuit of an $n^{th}$ order comb filter and an accumulation and dump circuit comprising an adder circuit having first and second signal inputs and a signal output, said first signal input being coupled to an output of the comb filter device and said signal output being coupled to the second signal input via a delay circuit for a signal delay of an input sampling frequency over one period, the output signal of the adder circuit being sampled at an output sampling frequency which is $1/(2n)$ the input sampling frequency and the accumulation and dump circuit being reset after each last-mentioned sampling.

17. A receiver as claimed in claim 16, characterized in that the $n^{th}$ order comb filter is arranged in cascade with $n-1$ further comb filters of the order 1 to $n-1$, respectively.

* * * * *